United States Patent
Pasadyn et al.

(10) Patent No.: US 6,901,340 B1
(45) Date of Patent: May 31, 2005

(54) METHOD AND APPARATUS FOR DISTINGUISHING BETWEEN SOURCES OF PROCESS VARIATION

(75) Inventors: Alexander J. Pasadyn, Austin, TX (US); Joyce S. Oey Hewett, Austin, TX (US); Christopher A. Bode, Austin, TX (US); Anthony J. Toprac, Austin, TX (US); Anastasia Oshelski Peterson, Austin, TX (US); Thomas J. Sonderman, Austin, TX (US); Michael L. Miller, Cedar Park, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 470 days.

(21) Appl. No.: 09/824,348

(22) Filed: Apr. 2, 2001

(51) Int. Cl.[7] ........................... G01N 37/00; G06F 19/00
(52) U.S. Cl. ...................................... 702/84
(58) Field of Search .............................. 702/81, 83, 84, 702/188, 189; 700/108–110, 117, 121

(56) References Cited

U.S. PATENT DOCUMENTS

| | | | | |
|---|---|---|---|---|
| 5,053,815 A | * | 10/1991 | Wendell | 399/10 |
| 5,625,816 A | * | 4/1997 | Burdick | 707/103 R |
| 5,655,110 A | * | 8/1997 | Krivokapic et al. | 716/19 |
| 5,659,467 A | * | 8/1997 | Vickers | 700/9 |
| 5,844,850 A | * | 12/1998 | Tsutsui et al. | 365/200 |
| 5,886,909 A | * | 3/1999 | Milor et al. | 716/4 |
| 5,965,306 A | * | 10/1999 | Mansfield et al. | 430/22 |
| 5,985,497 A | * | 11/1999 | Phan et al. | 430/30 |
| 6,278,515 B1 | * | 8/2001 | Knight et al. | 355/55 |
| 6,298,470 B1 | * | 10/2001 | Breiner et al. | 716/4 |
| 6,369,891 B1 | * | 4/2002 | Kane et al. | 356/401 |
| 6,392,434 B1 | * | 5/2002 | Chiu | 324/765 |
| 6,445,206 B1 | * | 9/2002 | Montull et al. | 324/765 |
| 6,486,492 B1 | * | 11/2002 | Su | 257/48 |
| 6,535,776 B1 | * | 3/2003 | Tobin, Jr. et al. | 700/110 |
| 6,580,960 B1 | * | 6/2003 | Nicholson | 700/121 |
| 6,587,744 B1 | * | 7/2003 | Stoddard et al. | 700/121 |
| 6,623,333 B1 | * | 9/2003 | Patel et al. | 451/9 |
| 6,636,843 B2 | * | 10/2003 | Doddi et al. | 706/46 |
| 2001/0020194 A1 | * | 9/2001 | Takagi et al. | 700/109 |
| 2002/0121915 A1 | * | 9/2002 | Montull et al. | 324/765 |

* cited by examiner

*Primary Examiner*—John Barlow
*Assistant Examiner*—Demetrius Pretlow
(74) *Attorney, Agent, or Firm*—Williams, Morgan & Amerson

(57) ABSTRACT

A method for distinguishing between sources of process variation includes processing a plurality of manufactured items in a process flow; storing a set of production environment data associated with each of the manufactured items; identifying manufactured items associated with a process drift; generating a plurality of characteristic threads based on the production environment data; comparing the characteristic threads for at least those manufactured items associated with the process drift; and determining at least one potential cause for the process drift based on the comparison of the characteristic threads. A manufacturing system for distinguishing between sources of process variation is also provided. The manufacturing system includes a plurality of tools for processing manufactured items in a process flow, a database server, and a drift monitor.

29 Claims, 3 Drawing Sheets

METHOD AND APPARATUS FOR DISTINGUISHING BETWEEN SOURCES OF PROCESS VARIATION

BACKGROUND OF THE INVENTION

1. Field of the Invention

This invention relates generally to semiconductor device manufacturing and, more particularly, to a method and apparatus for distinguishing between sources of process variation.

2. Description of the Related Art

There is a contrast drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a lot of wafers using a variety of processing tools, including photolithography steppers, etch tools, deposition tools, polishing tools, rapid thermal processing tools, implantation tools, etc. The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender nonoptimal control of critical processing parameters, such as throughput, accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

Typically, during the fabrication of a semiconductor wafer, a metrology event immediately follows a process event to monitor the performance of the process. Multiple metrology tools may be employed to measure several metrics related to the process performance. After such metrology, adjustments to the operating parameters of process may be made to control the process output in light of a target value. Certain metrology tests, such as electrical performance tests (e.g., effective gate length and drive current), are not performed until many processing steps have been performed (i.e., typically after the first metal layer is formed). It is only at this point that the success of certain previous process events is evident. Although the electrical tests may identify a performance drift, the temporal displacement between the numerous process events and the metrology event makes it difficult to identify the source of the drift or readily adjust the process to account for the drift. Another condition that exacerbates the difficulty in identifying the source of a fault is the number of processing and metrology tools in the process flow. Typically, more than one tool for performing a particular process or metrology step is provided in the manufacturing facility. Each particular lot of wafers may pass through an entirely different set of tools during its production.

There are various ways for identifying process drifts. Generally, metrology data (i.e., performance or process) is gathered and evaluated against various rules to determine if an error condition has occurred. Although, various rules may be used, many companies have adopted the "Western Electric Rules", originally developed by the Western Electric Company. The results specify that an error occurs if:

Rule 1: One measurement exceeds three standard deviations from the target (i.e., $1>3\sigma$);

Rule 2: Two out of three consecutive measurements exceed two standard deviations from the target on one side of the target (i.e., $2/3>2\sigma$);

Rule 3: Four out of Five consecutive measurements exceed one standard deviation from the target on one side of the target (i.e., $4/5>\sigma$); and Rule 4: Eight consecutive points on one side of the target.

Rule 1 and 2 violations are typically associated with process faults or equipment failures. Rule 3 and 4 violations are most often useful for identifying process drifts. Process drifts may result in shifts in feature dimensions, such as oxide thickness or gate electrode length, for example. Such drifts may result in degraded performance of the final product or may cause difficulty for subsequent processing steps. Some drifts may also be the result of errant metrology tools. For example, if the calibration on a metrology tool used to measure process layer thickness is out of specification, the metrology information it provides to the manufacturing control system may be inaccurate. The control system may attempt to adjust the process to account for the drift in metrology data and actually compound the problem. Another potential cause for process drifts is changes to the operating parameters of a particular tool. Still another source for process variation is the characteristics of the incoming wafers to be processed in the tool prior to the metrology event that identifies the trend. For example, if a particular group of wafers has a dished or domes surface profile, the effectiveness of subsequent etch or polishing processes may be affected. A drift may not be caused by the etch or polishing tool, but rather due to the characteristics of the incoming wafers.

Because there are many sources of process variations, it is difficult to identify the actual source and take appropriate corrective actions. If the source of the process variation is misidentified, the corrective actions may serve to increase the process variation rather than compensate for it.

The present invention is directed to overcoming, or at least reducing the effects of, one or more of the problems set forth above.

SUMMARY OF THE INVENTION

One aspect of the present invention is seen in a method for distinguishing between sources of process variation. The method includes processing a plurality of manufactured items in a process flow; storing a set of production environment data associated with each of the manufactured items; identifying manufactured items associated with a process drift; generating a plurality of characteristics threads based on the production environment data; comparing the characteristics threads for at least those manufactured items associated with the process drift; and determining at least one potential cause for the process drift based on the comparison of the characteristic threads.

Another aspect of the present invention is seen in a manufacturing system including a plurality of tools for processing manufactured items in a process flow, a database server, and a drift monitor. The database server is adapted to store a set of production environment data associated with each of the manufactured items. The drift monitor is adapted to identify manufactured items associated with a process drift, generate a plurality of characteristic threads based on the production environment data, compare the characteristic threads for at least those manufactured items associated with the process drift, and determine at least one potential cause for the process drift based on the comparison of the characteristic threads.

BRIEF DESCRIPTION OF THE DRAWINGS

The invention may be understood by reference to the following description taken in conjunction with the accompanying drawings, in which like reference numerals identify like elements, and in which.

Figure 1:
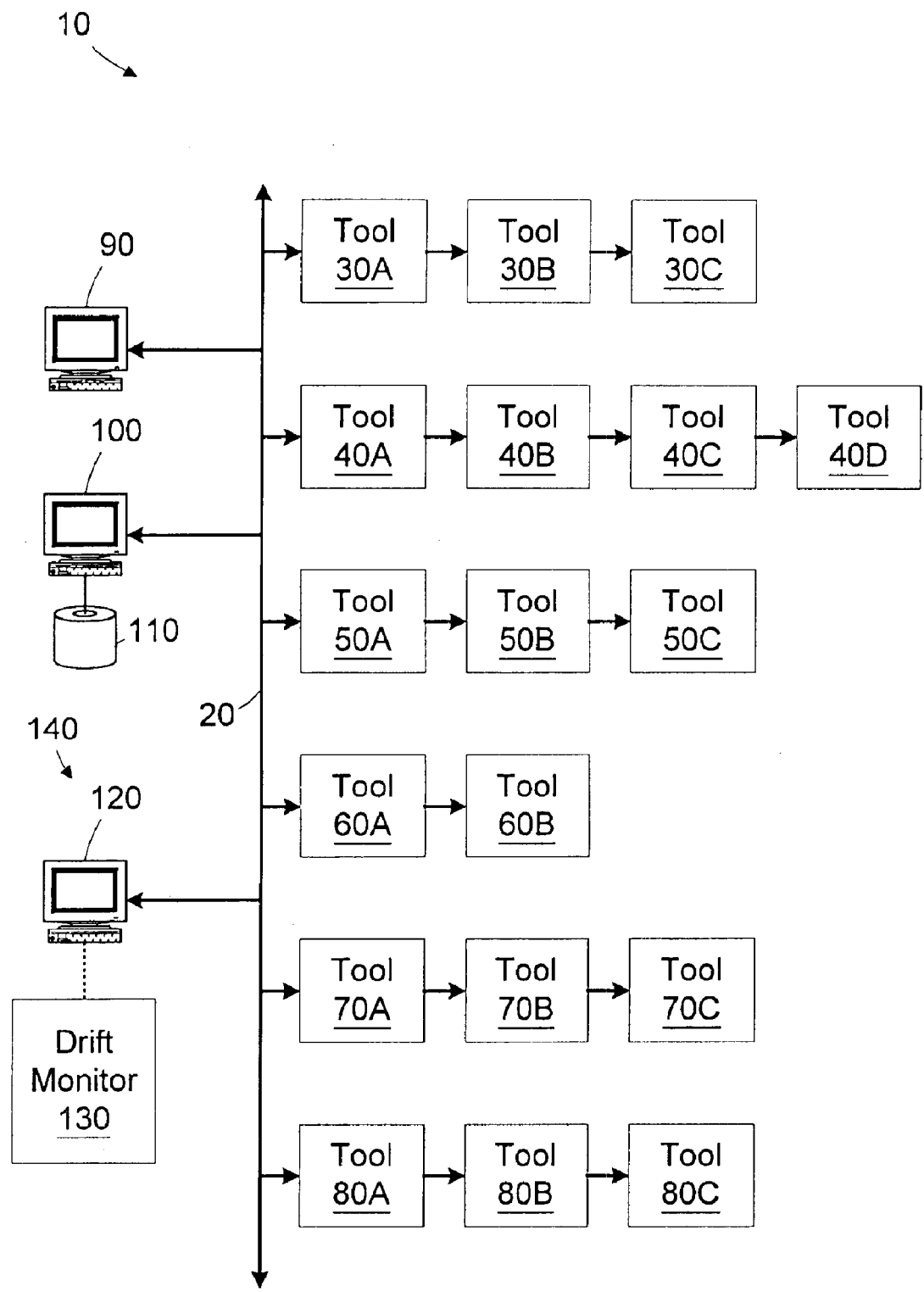
FIG. 1 is a simplified block diagram of a manufacturing system in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to FIG. 1, a simplified block diagram of an illustrative manufacturing system 10 is provided. In the illustrated embodiment, the manufacturing system 10 is adapted to fabricate semiconductor devices. Although the invention is described as it may be implemented in a semiconductor fabrication facility, the invention is not so limited and may be applied to other manufacturing environments. A network 20 interconnects various components of the manufacturing system 10, allowing them to exchange information. The illustrative manufacturing system 10 includes a plurality of tools 30–80. Each of the tools 30–80 may be coupled to a computer (not shown) for interfacing with the network 20.

A process control server 90 directs the high level operation of the manufacturing system 10 by directing the process flow of the manufacturing system 10. The process control server 90 monitors the status of the various entities in the manufacturing system 10, including the tools 30–80. A database server 100 is provided for storing data related to the status of the various entities and articles of manufacture (e.g., wafers) in the process flow. The database server 100 may store information in one or more data stores 110. The data may include pre-process and post-process metrology data, tool states, process flow activities (e.g., scheduled maintenance events, processing routes for lots of wafers), etc. The distribution of the processing and data storage functions amongst the different computers is generally conducted to provide independence and a central information store. Of course, more or fewer computers may be used.

An exemplary information exchange and process control framework suitable for use in the manufacturing system 10 is an Advance Process Control (APC) framework, such as may be implemented using the Catalyst system offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specification are publicly available from SEMI.

Portions of the invention and corresponding detailed description are presented in terms of software, or algorithms and symbolic representations of operations on data bits within a computer memory. Those descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

The tools 30–80 are grouped into sets of like tools, as denoted by lettered suffixes. For example, the set of tools 30A–30C represent tools of a certain type, such as a photolithography stepper. A particular wafer or lot of wafers progresses through the tools 30–80 as it is being manufactured, with each tool 30–80 performing a specific function in the process flow. Exemplary tools 30–80, include metrology tools and processing tools, such as photolithography steppers, etch tools, deposition tools, polishing tools, rapid thermal processing tools, implantation tools, etc. Typically, the path a particular wafer or lot passes through the process flow varies. Certain tools 30–80 may be out-of-service for maintenance or otherwise occupied processing other lots. The process control server 90 routes the individual lots through the process flow depending on the steps that need to be performed and the availabilities of the tools 30–80. A particular lot of wafers may pass through the same tool 30–80 more than once in production (e.g., a particular stepper may be used for more than one masking operation).

The tools 30–80 are illustrated in a rank and file grouping for illustrative purposes only. In an actual implementation, the tools may be arranged in any order of grouping. Additionally, the connections between the tools in a particular groupings are meant to represent only connections to the network 20, rather than interconnection between the tools.

The process control server 90 stores information related to the particular tools 30–80 used to process each lot of wafers in the data store 110. As metrology data is collected related to the lot, the metrology data and a tool identifier indicating the identity of the metrology tool recording the measurements is also stored in the data store 110. The metrology data may include feature measurements, process layer thicknesses, electrical performance, surface profiles, etc. Maintenance history for the tools 30–80 (e.g., cleaning, consumable item replacement, repair) is also stored in the data store 110 by the process control server 90 or by a tool operator. Collectively, the metrology data and the tool data may be referred to as production environment data. Each particular lot of wafers has a unique set of production environment data. The production environment data defines the physical history of the wafers in the lot (i.e., based on the physical and performance metrology data) and the processing history of the wafers in the lot (i.e., based on tool and recipe data).

The manufacturing system 10 includes a statistical process control (SPC) client computer 120 adapted to execute a drift monitoring application program (drift monitor) 130 to identify the sources of process drifts. The drift monitor 130 may be adapted to automatically identify process drifts (e.g., by identifying rule 3 or 4 violations). Alternatively, the drift monitor 130 may be initiated manually after a process drift has been noticed by a tool operator or process owner. For example, if the electrical performance of a group of wafers is substandard, the tool monitor 130 may be used to attempt to identify a common cause.

The drift monitor 130 identifiers a set of lots that appear to be involved in the process drift. The size of the set may vary, depending on the particular implementation. The set may also include a number of lots not associated with the process drift to help rule out certain common causes. For example, if a number of lots associated with the process drift are measured with a particular metrology tool, it may be designated as the cause of the drift. However, if other lots that were also measured by the same metrology tool do not have a similar drift problem, the actual source of the process drift may be different.

Although the invention is described as it may be implemented by identifying lots of wafers associated with the process drift, the invention is not so limited. The degree of granularity depends on factors such as the level of metrology information and the degree of control available. Typically, control in a semiconductor fabrication facility is performed on a lot-by-lot basis. However, in more advanced fabrication facilities, control is shifting to a wafer-by-wafer basis. Accordingly, process drifts and subsequent analysis may be designated by a lot-by-lot wafer-by-wafer, or some other grouping basis.

Figure 2:
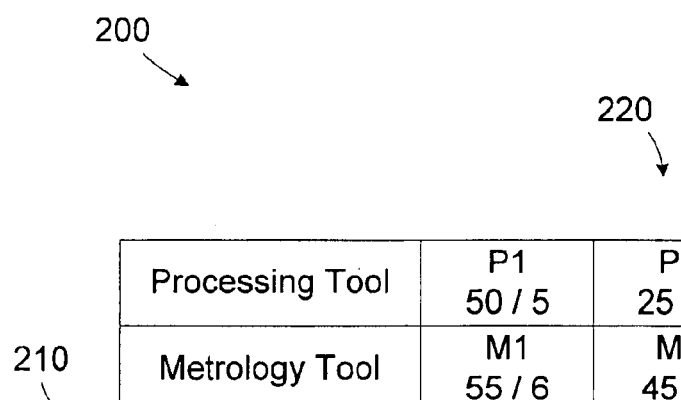
FIG. 2 is a diagram of a characteristic thread matrix used to identify sources of process drifts by a drift monitor in the manufacturing system on FIG. 1.

The drift monitor 130 generates characteristic threads based on the production environment data to identify common characteristics of the wafers involved in the drift. FIG. 2 illustrates an exemplary characteristic thread matrix 200 for generating characteristic threads as may used by the drift monitor 130. In the example illustrated in FIG. 2, the drift monitor 130 is analyzing a drift in the thickness of a process layer of silicon dioxide. A sample size of 100 total lots of wafers, with 10 lots being associated with the drift condition, is shown. For clarity and ease of illustration, only a few characteristic threads are illustrated in FIG. 2. Specifically, the drift monitor 130 generates threads based on processing tool, metrology tool, incoming wafer profile, and deposition time. In an actual implementation, many more threads may be used. For example, characteristic threads may be based on different processing tools, different operating recipe parameters, and other incoming wafer characteristics.

The characteristic thread matrix 200 includes a plurality of characteristic categories 210 and a plurality of corresponding characteristic threads. The results of each characteristic thread is shown using the notation "A/B," where A is the total number of lots in the characteristic thread, and B is the total number of lots in the characteristic thread associated with the drift condition. The sample size of 100 lots is based on a plurality of lots recently processed in the manufacturing system 10. Typically, only recent lots are selected for drift analysis. Lots older than two days, for example, may be eliminated by filtering the production environment data. Filtering may also be conducted to remove threads not likely to cause a drift, or likely to cause a drift in the opposite direction than the one identified. For example, the drift may be related to an increase in oxide thickness. Threads related to metrology of metal critical dimensions, for example, may be eliminated from further investigation.

The results of the characteristic threads 200 illustrated in FIG. 2 show that the processing tools and the metrology tools are not likely to be the source of the drift. The distribution of wafers associated with the drift is roughly equal to the total distribution of wafer processed. Likewise, the deposition time characteristic threads 220 do not show any likely candidates. However, the wafer profile characteristic thread 220 show a possible deviation. Note that of the 25 lots of wafers having a domed profile that were processed, 8 were involved with the process drift. Based on the noted deviation, it is likely that the source of the process drift was related to the domed profile of the incoming wafers. Based on this knowledge, a corrective action may be to adjust the operating recipes of previous processing tools in the process flow to try to reduce the number of wafers being generated with a domed profile. For example, polishing tools typically are prone to polishing with either a center fast or center slow polishing characteristic. The operating parameters of the polishing tools may be adjusted to decrease the tendency to polish with a center slow characteristic.

The example illustrated above with reference to FIG. 2 was simplified for ease of illustration. In an actual characteristic thread analysis, the drift monitor 130 may identify a plurality of suspect characteristic threads 220 requiring further investigation. Although a definitive source of the drift may not be immediately discernible, a narrowed down list of potential drift sources greatly reduces the time and resources required to identify and correct the cause.

Figure 3:
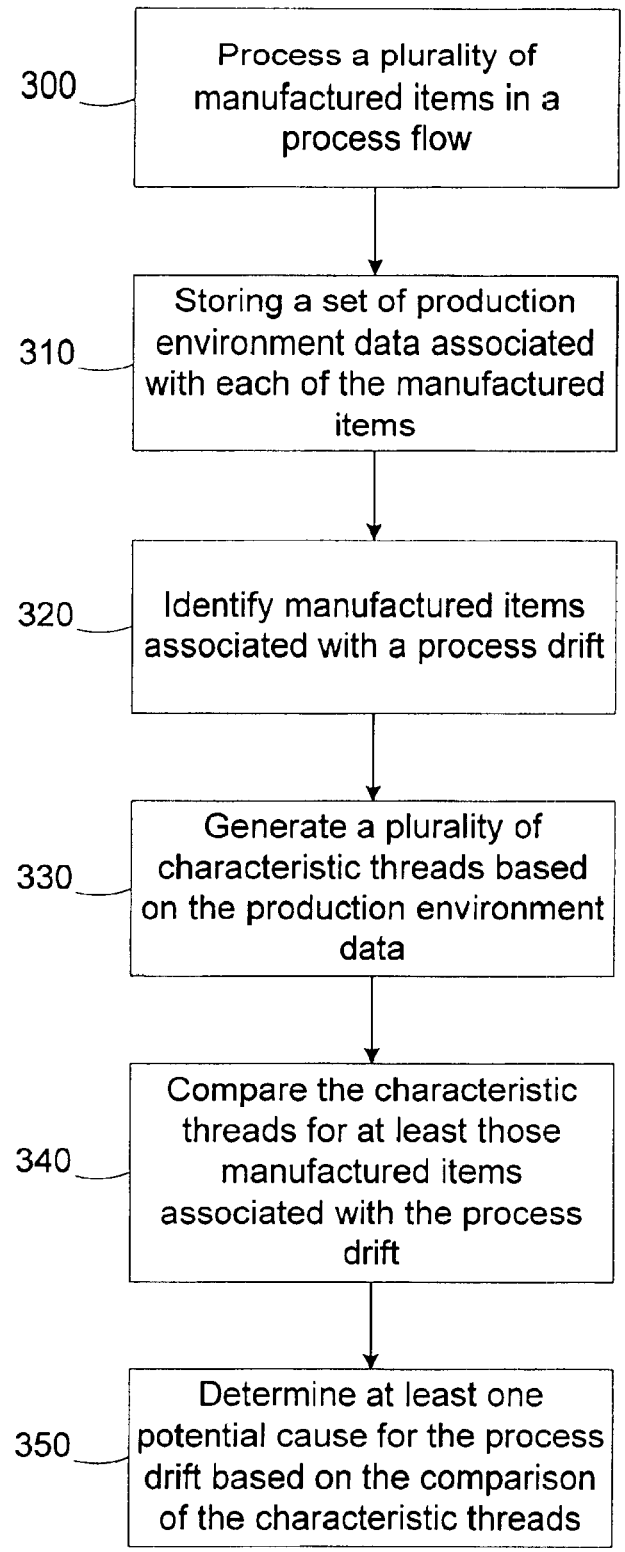
FIG. 3 is a simplified flow diagram of a method for distinguishing between sources of process variation in accordance with another embodiment of the present invention.

Turning now to FIG. 3, a simplified flow diagram of a method for distinguishing between sources of process variation in accordance with another embodiment of the present invention is provided. In block 300, a plurality of manufactured items is processed in a process flow. In block 310, a set of production environment data associated with each of the manufactured items is stored. In block 320, manufactured items associated with a process drift are identified. In block 330, a plurality of characteristic threads is generated based on the production environment data. In block 340, the characteristic threads for at least those manufactured items associated with the process drift are compared. In block 350, at least one potential cause for the process drift is determined based on the comparison of the characteristic threads.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for distinguishing between sources of process variation, comprising:
   processing a plurality of manufactured items in a process flow;
   storing a set of production environment data associated with the manufactured items;
   identifying manufactured items associated with a process drift;
   generating a plurality of characteristic threads based on the production environment data, at least one of the characteristic threads being associated with other than processing tools used in the process flow;
   comparing the characteristic threads for at least those manufactured items associated with the process drift; and
   determining at least one potential cause for the process drift based on the comparison of the characteristic threads.

2. The method of claim 1, wherein generating the plurality of characteristic threads based on the production environment data comprises generating characteristic threads for metrology tools used to measure characteristics of semiconductor wafers in the process flow.

3. The method of claim 1, wherein generating the plurality of characteristic threads based on the production environment data comprises generating characteristic threads based on incoming characteristics of semiconductor wafers in the process flow.

4. The method of claim 1, wherein generating the plurality of characteristic threads based on the production environment data comprises generating characteristic threads based on operating recipe parameters used for processing semiconductor wafers in the process flow.

5. The method of claim 1, wherein processing the plurality of manufactured items in the process flow comprises processing a plurality of semiconductor wafers in a semiconductor device manufacturing process flow.

6. The method of claim 5, wherein processing the plurality of semiconductor wafers comprises processing the plurality of semiconductor wafers grouped into lots of wafers, and identifying the manufactured items associated with the process drift comprises identifying particular lots of wafer associated with the process drift.

7. The method of claim 1, further comprising grouping the characteristic threads into characteristic categories.

8. The method of claim 7, wherein comparing the characteristic threads comprises comparing the characteristic threads in a particular characteristic category for all of the manufactured items to the characteristic threads in the particular characteristic category for the manufactured items associated with the process drift.

9. The method of claim 8, further comprising calculating a plurality of characteristic thread ratios, wherein each characteristic thread ratio comprises the ratio of manufactured items in the characteristic thread associated with the process drift to a total number of manufactured items in the characteristic thread.

10. The method of claim 9, wherein determining the at least one potential cause for the process drift comprises identifying a particular characteristic thread ratio in one characteristic category that differs from other characteristics thread ratios in the same characteristic category.

11. A method for distinguishing between sources of process variation, comprising:
    processing a plurality of manufactured items in a process flow;
    storing a set of production environment data associated with the manufactured items;
    identifying manufactured items associated with a process drift;
    generating a plurality of characteristic threads based on the production environment data;
    grouping the characteristic threads into characteristic categories;
    comparing the characteristic threads in a particular characteristic category for all of the manufactured items to the characteristic threads in the particular characteristic category for the manufactured items associated with the process drift; and
    determining at least one potential cause for the process drift based on the comparison of the characteristic threads.

12. The method of claim 11, further comprising calculating a plurality of characteristic thread ratios, wherein each characteristic thread ratio comprises the ratio of manufactured items in the characteristic thread associated with the process drift to a total number of manufactured items in the characteristic thread.

13. The method of claim 11, wherein determining the at least one potential cause for the process drift comprises identifying a particular characteristic thread ratio in one characteristic category that differs from other characteristics thread ratios in the same characteristic category.

14. The method of claim 11, wherein processing the plurality of manufactured items in the process flow comprises processing a plurality of semiconductor wafers in a semiconductor device manufacturing process flow, and wherein generating the plurality of characteristic threads based on the production environment data comprises generating characteristic threads for at least one of processing tools in the process flow, metrology tools used to measure characteristics of semiconductor wafers in the process flow, incoming characteristics of semiconductor wafers in the process flow, and operating recipe parameters used for processing semiconductor wafers in the process flow.

15. A manufacturing system, comprising:
- a plurality of tools for processing manufactured items in a process flow;
- a database server adapted to store a set of production environment data associated with the manufactured items; and
- a drift monitor adapted to identify manufactured items associated with a process drift, generate a plurality of characteristic threads based on the production environment data, at least one of the characteristic threads being associated with other than processing tools used in the process flow, compare the characteristic threads for at least those manufactured items associated with the process drift, and determine at least one potential cause for the process drift based on the comparison of the characteristic threads.

16. The manufacturing system of claim 15, wherein the drift monitor is adapted to group the characteristic threads into characteristic categories.

17. The manufacturing system of claim 16, wherein the drift monitor is adapted to compare the characteristic threads in a particular characteristic category for all of the manufactured items to the characteristic threads in the particular characteristic category for the manufactured items associated with the process drift.

18. The manufacturing system of claim 17, wherein the drift monitor is adapted to calculate a plurality of characteristic thread ratios, wherein each characteristic thread ratio comprises the ratio of manufactured items in the characteristic thread associated with the process drift to a total number of manufactured items in the characteristic thread.

19. The manufacturing system of claim 18, wherein the drift monitor is adapted to identify a particular characteristic thread ratio in one characteristic category that differs from other characteristics thread ratios in the same characteristic category as the at least one potential cause for the process drift.

20. The manufacturing system of claim 15, wherein the manufactured items comprise semiconductor wafers processed in a semiconductor device manufacturing process flow.

21. The manufacturing system of claim 20, wherein the semiconductor wafers are grouped into lots of wafers, and the drift monitor is adapted to and identify particular lots of wafers associated with the process drift.

22. The manufacturing system of claim 20, wherein the drift monitor is adapted to generate characteristic threads for metrology tools used to measure characteristics of semiconductor wafers in the process flow.

23. The manufacturing system of claim 20, wherein the drift monitor is adapted to generate characteristic threads based on incoming characteristics of semiconductor wafers in the process flow.

24. The manufacturing system of claim 20, wherein the drift monitor is adapted to generate characteristic threads based on operating recipe parameters used for processing semiconductor wafers in the process flow.

25. A manufacturing system, comprising:
- a plurality of tools for processing manufactured items in a process flow;
- a database server adapted to store a set of production environment data associated with the manufactured items; and
- a drift monitor adapted to identify manufactured items associated with a process drift, generate a plurality of characteristic threads based on the production environment data, group the characteristic threads into characteristic categories, compare the characteristic threads in a particular characteristic category for all of the manufactured items to the characteristic threads in the particular characteristic category for the manufactured items associated with the process drift, and determine at least one potential cause for the process drift based on the comparison of the characteristic threads.

26. The manufacturing system of claim 25, wherein the drift monitor is adapted to calculate a plurality of characteristic thread ratios, wherein each characteristic thread ratio comprises the ratio of manufactured items in the characteristic thread associated with the process drift to a total number of manufactured items in the characteristic thread.

27. The manufacturing system of claim 26, wherein the drift monitor is adapted to identify a particular characteristic thread ratio in one characteristic category that differs from other characteristics thread ratios in the same characteristic category as the at least one potential cause for the process drift.

28. A manufacturing system, comprising:
- a plurality of tools for processing semiconductor wafers in a semiconductor device manufacturing process flow;
- a database server adapted to store a set of production environment data associated with the semiconductor wafers; and
- a drift monitor adapted to identify semiconductor wafers associated with a process drift, generate a plurality of characteristic threads based on the production environment data including characteristic threads for processing tools in the process flow, compare the characteristic threads for at least those semiconductor wafers associated with the process drift, and determine at least one potential cause for the process drift based on the comparison of the characteristic threads.

29. A manufacturing system, comprising:
- means for processing a plurality of manufactured items in a process flow;
- means for storing a set of production environment data associated with the manufactured items;
- means for identifying manufactured items associated with a process drift;
- means for generating a plurality of characteristic threads based on the production environment data, at least one of the characteristic threads being associated with other than processing tools used in the process flow;
- means for comparing the characteristic threads for at least those manufactured items associated with the process drift; and
- means for determining at least one potential cause for the process drift based on the comparison of the characteristic threads.

* * * * *